US008904734B2

(12) United States Patent
Lucas et al.

(10) Patent No.: US 8,904,734 B2
(45) Date of Patent: Dec. 9, 2014

(54) METHOD FOR MOUNTING A SOLAR PANEL SUPPORT STRUCTURE BY EMBEDDING ITS LEGS

(75) Inventors: Adrien Lucas, Bordeaux (FR); Frédéric Morane, Cambes (FR)

(73) Assignee: Exosun, Martillac (FR)

( * ) Notice: Subject to any disclaimer, the term of this patent is extended or adjusted under 35 U.S.C. 154(b) by 149 days.

(21) Appl. No.: 13/500,417

(22) PCT Filed: Oct. 7, 2010

(86) PCT No.: PCT/EP2010/064982
§ 371 (c)(1),
(2), (4) Date: Apr. 5, 2012

(87) PCT Pub. No.: WO2011/042488
PCT Pub. Date: Apr. 14, 2011

(65) Prior Publication Data
US 2012/0192422 A1    Aug. 2, 2012

(30) Foreign Application Priority Data

Oct. 7, 2009    (FR) ...................................... 09 56988

(51) Int. Cl.
*E02D 27/26*    (2006.01)
*H01L 31/042*   (2014.01)
*F24J 2/54*     (2006.01)
*F24J 2/52*     (2006.01)

(52) U.S. Cl.
CPC ............. *H01L 31/0422* (2013.01); *Y02E 10/50* (2013.01); *Y02E 10/47* (2013.01); *F24J 2/5413* (2013.01); *F24J 2/5233* (2013.01)
USPC ..................... 52/741.15; 52/742.14; 52/173.3; 52/745.17

(58) Field of Classification Search
CPC ............. F24J 2/52; F24J 2/523; E02D 27/26; E02D 5/54; E02D 5/36; E02D 27/32
USPC .................. 52/173.3, 292, 294–299, 741.11, 52/741.14, 742.1, 742.12, 742.13, 742.14, 52/742.15, 143, 745.17, 741.15; 136/243–246; 126/621, 623; 248/679, 248/530, 156, 163.1, 176.1, 188, 346.02, 248/346.03; 405/224, 229, 231
See application file for complete search history.

(56) References Cited

U.S. PATENT DOCUMENTS 3,830,024 A * 8/1974 Warnke .............................. 52/23
4,570,409 A * 2/1986 Wilks .......................... 52/741.15
(Continued)

FOREIGN PATENT DOCUMENTS

| DE | 199 22 795 A1 | 11/2000 |
| DE | 10 2005 015 346 A1 | 10/2006 |
| EP | 1 970 643 A1 | 9/2008 |

OTHER PUBLICATIONS

European Patent Office, International Search Report in International Patent Application No. PCT/EP2010/064982 (Mar. 1, 2011).

*Primary Examiner* — William Gilbert
*Assistant Examiner* — Beth Stephan
(74) *Attorney, Agent, or Firm* — Brinks Gilson & Lione; G. Peter Nichols

(57) ABSTRACT

A method for embedding at least one solar structure, including one or more anchoring legs, includes making one or more holes in which the at least one solar structure is to be installed; forming one or more concrete slabs in the hole(s) at one installation rib; after setting of the concrete slab(s), locating the position(s) of the anchoring leg(s) of the at least one solar structure on the concrete slab(s); installing the at least one solar structure in the hole(s), with the anchoring leg(s) bearing on the concrete slab(s) at the position(s) of the anchoring leg(s) that were located beforehand; and embedding the at least one solar structure.

8 Claims, 3 Drawing Sheets

(56) References Cited

U.S. PATENT DOCUMENTS

| | | | |
|---|---|---|---|
| 5,125,608 A * | 6/1992 | McMaster et al. | 248/163.1 |
| 5,228,924 A * | 7/1993 | Barker et al. | 136/246 |
| 5,398,478 A * | 3/1995 | Gordin et al. | 52/741.14 |
| 5,613,658 A * | 3/1997 | Rogelja | 248/163.1 |
| 5,689,927 A * | 11/1997 | Knight, Sr. | 52/297 |
| 6,076,320 A * | 6/2000 | Butler | 52/294 |
| 6,205,725 B1 * | 3/2001 | Butler | 52/292 |
| 6,389,760 B1 * | 5/2002 | McDonnell | 52/165 |
| 6,393,748 B1 * | 5/2002 | Cooper | 40/610 |
| 6,481,165 B1 * | 11/2002 | Romary et al. | 52/122.1 |
| 6,837,006 B2 * | 1/2005 | Deskin | 52/3 |
| 7,506,859 B2 * | 3/2009 | Keller et al. | 256/65.14 |
| 7,531,741 B1 * | 5/2009 | Melton et al. | 136/246 |
| 7,596,923 B1 * | 10/2009 | Thomas et al. | 52/741.13 |
| 7,884,279 B2 * | 2/2011 | Dold et al. | 136/246 |
| 8,413,391 B2 * | 4/2013 | Seery et al. | 52/173.3 |
| 2002/0007613 A1 * | 1/2002 | Gordin et al. | 52/726.4 |
| 2003/0034029 A1 * | 2/2003 | Shingleton | 126/600 |
| 2003/0070705 A1 * | 4/2003 | Hayden et al. | 136/251 |
| 2003/0189153 A1 * | 10/2003 | Nakabayashi et al. | 248/346.02 |
| 2007/0068094 A1 * | 3/2007 | Fralish | 52/143 |
| 2009/0056273 A1 * | 3/2009 | Ferro De La Cruz | 52/749.1 |
| 2009/0133689 A1 | 5/2009 | Conchy et al. | |

\* cited by examiner

METHOD FOR MOUNTING A SOLAR PANEL SUPPORT STRUCTURE BY EMBEDDING ITS LEGS

FIELD OF THE INVENTION

The invention relates to the field of tracking solar panels, the orientation of which can change as a function of the variation of sunlight during the day and throughout the year.

The invention more particularly relates to the embedding in the ground of support structures for solar panels.

BACKGROUND OF THE INVENTION

Commonly, a solar panel support structure according to the state of the art, for example illustrated in FIG. 2, comprises a support structure 2 that makes it possible to support an element (not shown) supporting a solar panel for processing sunlight. The solar panel is generally made up of a plurality of photovoltaic cells. The solar panel can be mounted to be stationary. Alternatively, the solar panel may comprise a system for actuating the solar panel for controlling the general inclination of the solar panel around an axis X relative to the ground.

That is why it is important for the support structure 2 to be firmly embedded in the right position so that the control of the general inclination of the solar panel is not distorted by poor positioning of the support structure 2.

Known in the state-of-the-art is a method for embedding support structures that comprises the following steps:

making holes in the ground so as to embed one or more support structures therein, pouring a layer of concrete so as to produce a concrete slab, embedding fastening and adjusting means for a support structure therein in a predetermined position, after a suitable time (for the concrete to set), placing the support structure on the fastening and adjustment means or on the concrete slab, adjusting the spatial positioning of the solar structure using the fastening and adjustment means.

However, criticisms have been leveled regarding such a method for embedding a support structure. In fact, concrete having a significant dimensional weight and a rheology making it not very fluid, the pouring step can create destabilization problems of the fastening and adjustment means of the support structure, which can therefore be moved from the predetermined position. As a result, after the concrete layer has set, the support structure embedded in the ground and poorly positioned can create inclination errors in the control of the solar panel, which creates deterioration in the output of the solar panel, in particular when the support structure bearing the solar panel is poorly aligned heightwise.

SUMMARY OF THE INVENTION

Thus, one aim of the present invention is to provide a method for embedding a solar panel support structure that is fast and inexpensive, and that makes it possible to avoid any poor placement of the support structure when the latter is embedded, in particular during the pouring of the concrete slab.

To that end, the invention provides a method for embedding a support structure comprising one or more anchoring legs, including the following steps:

making one or more holes in which the support structure is to be installed;

making one or more concrete slabs in the hole(s) at one installation side;

after setting of the concrete slab(s), locating the position(s) of the anchoring leg(s) of the at least one support structure on the concrete slab(s);

installing the support structure in the hole(s), the anchoring leg(s) bearing on the concrete slab(s) at the position(s) of the anchoring leg(s) that were located beforehand; and embedding the support structure.

Advantageously, but optionally, the embedding method according to the invention also comprises at least one of the following features:

Beforehand, the method includes the following step: staking to determine the installation site.

The embedding of the support structure includes a step for pouring concrete in the hole(s).

The embedding of the at least one support structure includes a prior step of making a casing around the anchoring leg(s) in the hole(s).

The production of one or more concrete slab(s) includes a prior step of placing a lattice on shims at the bottom of the hole(s).

The production of one or more concrete slabs includes the placement of connecting means in the vicinity of the position of the anchoring leg(s).

The embedding of the support structure includes a prior step of fastening the anchoring leg(s) using the connecting means.

Before installing the support structure, the support structure is assembled on a jig.

The jig is installed near the hole(s), the support structure, once assembled, is moved from the jig to the hole(s).

Before installing the support structure, a maintenance and handling belt (10) is fastened around the support structure.

Before or after embedding the support structure, the maintenance and handling belt is removed.

BRIEF DESCRIPTION OF THE FIGURES

Other features and advantages of the invention will appear in the following description of one embodiment of the invention. In the appended drawings.

DETAILED DESCRIPTION

Figure 1:
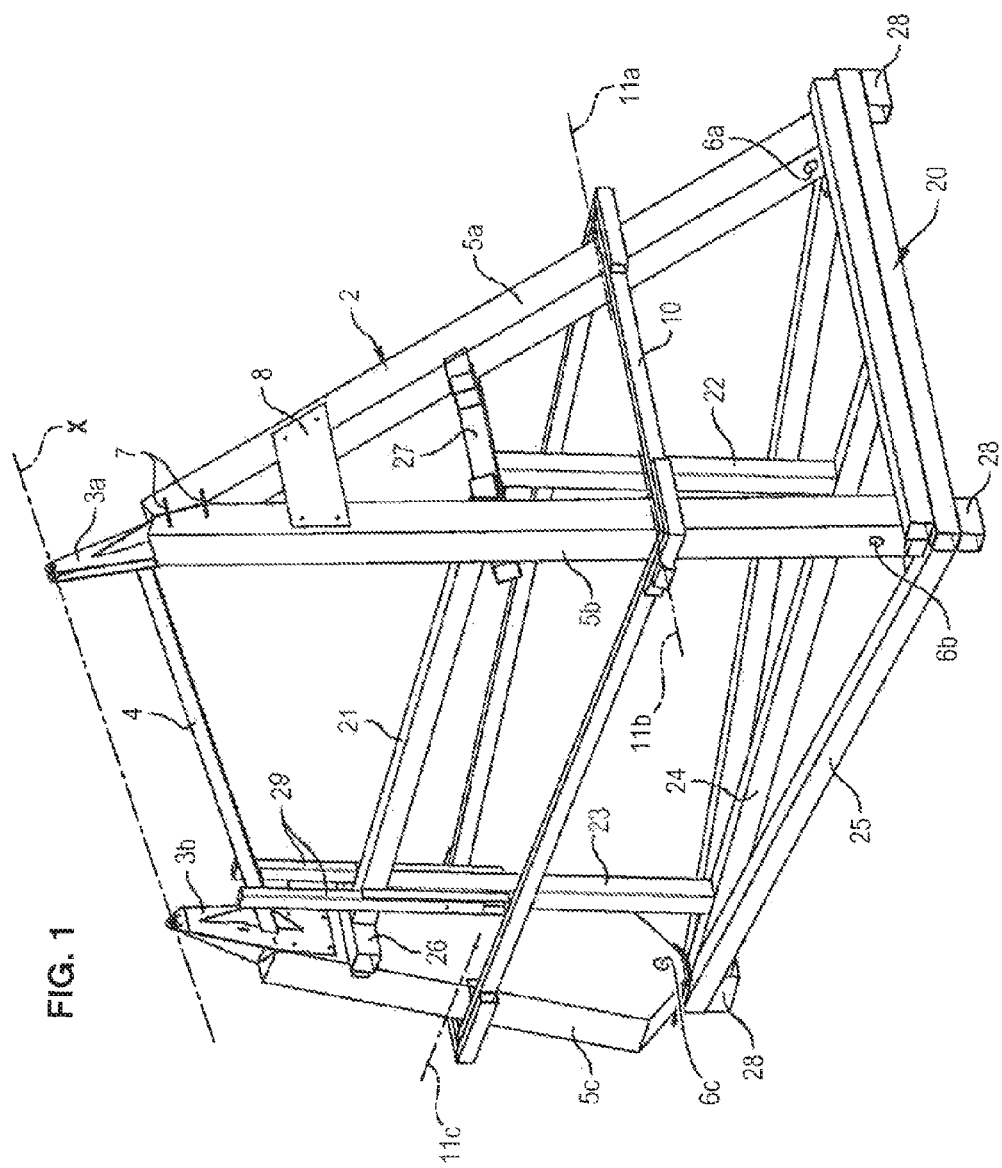
FIG. 1 is a three-dimensional view of the solar panel support structure comprising three anchoring legs and a jig and a maintenance and handling belt in place.

A solar panel support structure 2 intended for supporting a solar panel will be described in reference to FIG. 1. The embodiment of the support structure 2 that will be described is provided only as an illustration, one skilled in the art easily being able to adapt the following to any other type of solar panel support structure that may require a jig and be installed using an embedding method according to the invention that will be described later.

The support structure 2 here comprises three anchoring legs 5a, 5b, and 5c, a connecting bar 4, and two mounting ends 3a and 3b for a solar panel (not shown) that is intended to be able to rotate around an axis of rotation X. The anchoring ends of the anchoring legs 5a, 5b, and 5c each comprise a through opening 6a, 6b, and 6c.

In order to assemble such a support structure 2, a jig 20 is provided. This jig 20 comprises a tubular polygonal base 25 (here, tubes with a square section) mounted on respective anchoring ends 28 that are situated at each apex of the polygonal base and at the ends of anchoring legs 5a, 5b, and 5c. In the case illustrated in FIG. 1, the polygonal base is a triangle. In general, the polygonal base comprises as many apexes as there are anchoring legs of the support structure 2. Each apex receives an anchoring leg end of the support structure 2 to be assembled. The jig comprises a middle bar 24 passing through the polygonal base 25. Perpendicular to the polygonal base 25, two posts 22 and 23 rise from the middle bar 24 at the free ends of which a reinforcing bar 21 is fastened, here substantially parallel to the middle bar 24. Jaws 26 and 27 are provided at respective ends of the reinforcing bar 21. These jaws 26 and 27 make it possible to maintain the anchoring legs 5a, 5b, and 5c in position for assembly of the support structure 2. The jaws 26 and 27 are positioned to maintain a relative spatial position between the various anchoring legs of the support structure 2 to be assembled. An additional jaw 29 is provided to receive the connecting bar 4. This prevents any tilting of the support structure 2 during the assembly thereof.

During the assembly of the support structure 2, the anchoring legs 5a, 5b, and 5c are spatially positioned on the jig 20 bearing in the jaws 26 and 27, the anchoring end 28 of each of the anchoring legs being in a position at an apex of the polygonal base 25. In the case at hand, the anchoring leg 5c rests bearing on the jaw 26 so that the end of the anchoring leg, opposite the anchoring end 28, is in contact, as illustrated in FIG. 1. From there, the two anchoring legs 5a and 5b are fastened to one another with the connecting bar 4 by staple 7 and/or the installation of a connecting plate 8. Any other appropriate connecting means may be used to that end.

Then, the mounting end 3a is assembled at and in contact with the ends of the anchoring legs 5a and 5b. The mounting end 3b is assembled on the end opposite the anchoring end of the anchoring leg 5c. The connecting bar 4 connects the two assembly ends 3a and 3b.

The support structure 2 is thus assembled. A maintenance and handling belt 10 is positioned around the anchoring legs 5a, 5b, and 5c. Here, the maintenance and handling belt 10 is fastened at the lower half of the anchoring legs, heightwise, using through pins 11a, 11b, and 11c. In one alternative embodiment, the maintenance and handling belt is positioned at one third of the height of the anchoring legs. Any other fastening means can be used to fasten the belt 10 to the support structure 2.

Figure 2:
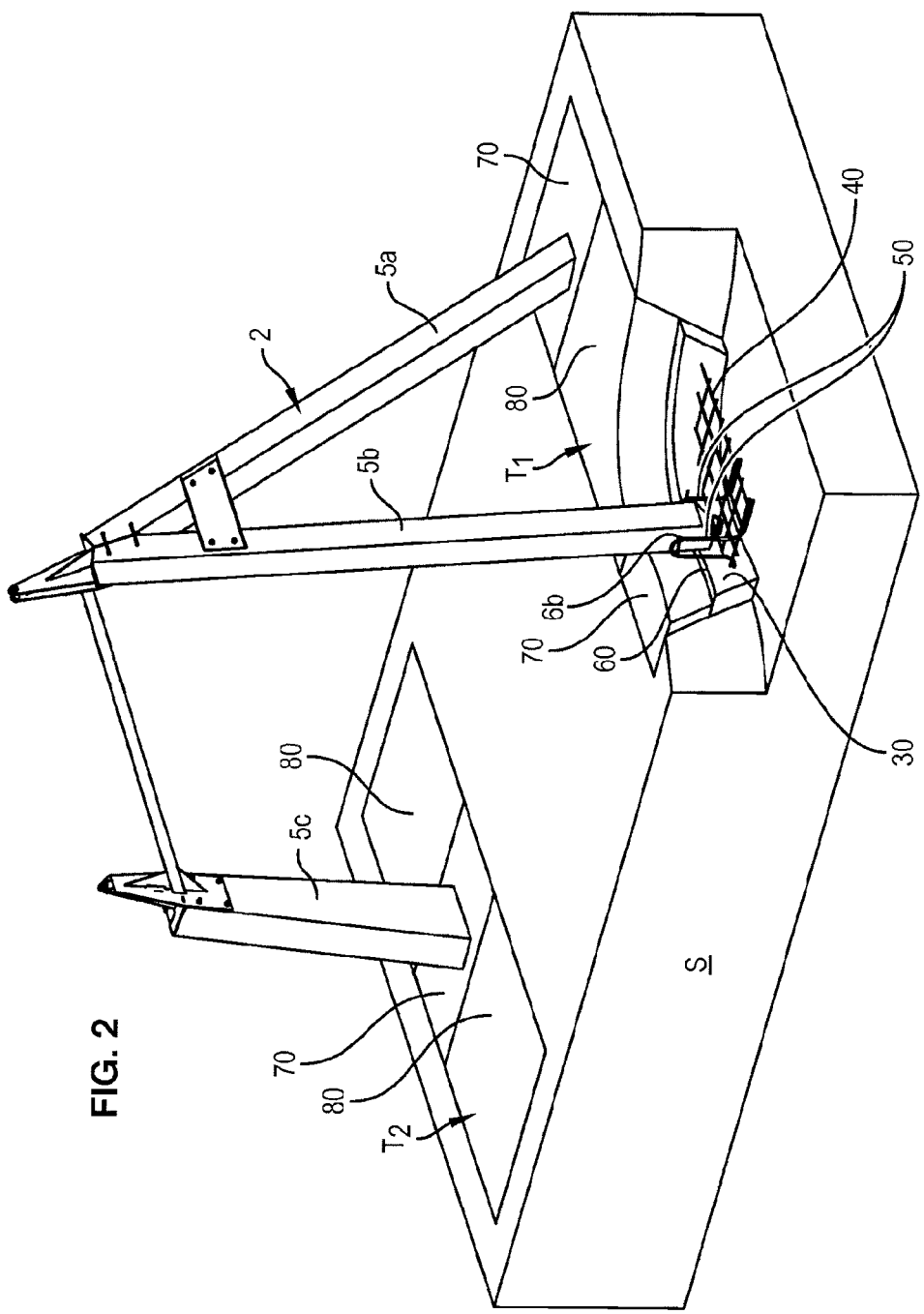
FIG. 2 is a three-dimensional view of the solar panel support structure of FIG. 1 in place using an embedding method according to the invention.
Figure 3:
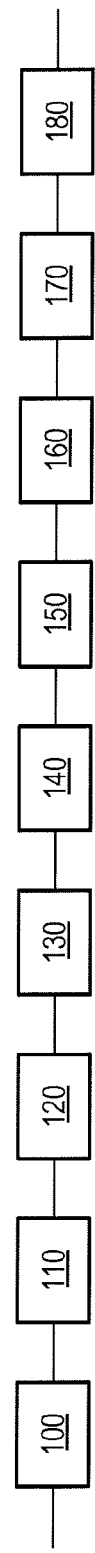
FIG. 3 is a diagram of the embedding method according to the invention.

In reference to FIGS. 2 and 3, an embedding method according to the invention will now be described for embedding the support structure 2 in the ground. The embedding method according to the invention for embedding the support structure 2 includes the following steps:

making (step 100) two holes T1 and T2 within the mounting site S in which the anchoring ends of the anchoring legs 5a, 5b, and 5c are intended to be embedded. The production of these holes T1, T2 is known from the state of the art and will not be described in more detail. In order to improve the embedding of the support structures 2, a welded lattice 40 is placed on shims at the bottom of the holes T1, T2.

installing (step 110) one or more stakes for positioning one side wall of each hole T1 and T2, as well as positioning the anchoring ends of the support structure 2. More specifically, the aim is to determine the thickness of a concrete slab 30 to be poured, on the one hand, and, on the other hand, the positioning of the connecting means 50 of the support structure 2.

placing (step 120) connecting means 50 in the vicinity of the position of the anchoring ends of the support structure 2. These connecting means 50 here are concrete reinforcing bars deformed so as to have a U-shaped loop firmly secured to the lattice 40, an apex of the U-shaped loop being positioned above the side wall 60 of the concrete slab 30.

pouring (step 130) a concrete slab 30 in each of the holes T1 and T2 with the side wall.

assembling (step 140) the support structure 2 on the jig 20, as previously described. The jig is preferably installed on the support structure near the holes T1 and T2.

once the concrete slab(s) have set, identifying (step 150) the exact position of the anchoring legs of the support structure 2 on the concrete slab(s).

moving (step 160) the support structure from the jig to the holes T1 and T2 and installing the support structure 2 on the concrete slab(s), the anchoring end of each of the anchoring legs 5a, 5b, and 5c of the support structure 2 bearing on the concrete slab(s) at its respective position previously identified.

fastening (step 170) the anchoring legs to the connecting means 50. This fastening is done using concrete reinforcing bars positioned through the through openings 6a, 6b, and 6c and then firmly connecting them to the connecting means, here at the apexes of the U-shaped loops emerging from the concrete slab(s). The maintenance and handling belt 10 is removed from the support structure 2.

embedding (step 180) the support structure 2 by pouring an additional concrete layer 70. A casing can be formed around each anchoring leg so as to reduce the amount of concrete used to produce the additional layer 70. Once the additional layer of concrete has set, each hole T1, T2 is filled in with backfill 80.

In one alternative embodiment, a fibrous concrete can be used for pouring in order to improve the embedding and/or strength of the concrete slab(s) 30. In the latter case, the lattice 40 can be omitted.

With such a method, it is possible to control the positioning of the support structure 2 (±25 mm) during the step of pouring the concrete layer, thereby making it possible not to distort control of the inclination of the solar panels installed on the solar panel support structure, in particular by guaranteeing the positioning of the solar panel. Furthermore, during such an embedding method according to the invention, the tools can be reusable right away without having to wait for the concrete to set. In this way, the jig 20 and the maintenance and handling belt 20 are reusable right away to assemble a new support structure.

The invention claimed is:

1. A method for mounting a solar panel support structure, the method comprising:
   assembling a support structure for a solar panel, wherein the support structure includes a plurality of anchoring legs, each anchoring leg having an anchoring end, wherein assembling the support structure including assembling the anchoring legs to each other with a jig including a plurality of bars and posts, and including attaching the jig to each of the anchoring legs, proximate and spaced from the anchoring ends, to establish and maintain mutual spatial positions of the anchoring legs and anchoring ends;
   digging at least one hole in the ground and in which at least one of the anchoring ends is to be placed;
   forming a concrete slab in the at least one hole;
   positioning the anchoring end of one of the anchoring legs on the concrete slab in the at least one hole; and pouring concrete in the at least one hole and embedding the anchoring end of the anchoring leg positioned on the concrete slab in the at least one hole.

2. The method according to claim 1, including, before digging the at least one hole, locating a stake in the ground to determine location of the at least one hole.

3. The method according to claim 1, including, before forming the concrete slab, placing a lattice on shims in the at least one hole.

4. The method according to claim 3, including, in forming the concrete slab, placing connecting means proximate the position of the anchoring end positioned on the concrete slab.

5. The method according to claim 4, including, before embedding the anchoring end of the anchoring leg, fastening the anchoring leg to the concrete slab via the connecting means.

6. The method according to claim 1, including, after positioning the anchoring end on the concrete slab, removing the jig from the anchoring legs.

7. The method according to claim 1, including, in assembling the support structure, fastening a maintenance and handling belt to each of the anchoring legs at a location on the anchoring legs so that the jig is between the anchoring ends of the anchoring legs and the maintenance and handling belt.

8. The method according to claim 7, including, before or after embedding the anchoring end positioned on the concrete slab in the at least one hole, removing the maintenance and handling belt from the anchoring legs.

* * * * *